(12) United States Patent
Xue et al.

(10) Patent No.: US 9,190,290 B2
(45) Date of Patent: Nov. 17, 2015

(54) HALOGEN-FREE GAS-PHASE SILICON ETCH

(71) Applicant: Applied Materials, Inc., Santa Clara, CA (US)

(72) Inventors: Jun Xue, San Jose, CA (US); Chentsau Ying, Cupertino, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 45 days.

(21) Appl. No.: 14/231,180

(22) Filed: Mar. 31, 2014

(65) Prior Publication Data

US 2015/0279687 A1    Oct. 1, 2015

(51) Int. Cl.
 *H01L 37/00* (2006.01)
 *H01L 21/311* (2006.01)
 *H01L 21/3065* (2006.01)

(52) U.S. Cl.
 CPC ...... *H01L 21/31116* (2013.01); *H01L 21/3065* (2013.01)

(58) Field of Classification Search
 CPC . H01J 37/00; H01L 21/02252; H01L 21/3105
 See application file for complete search history.

(56) References Cited

U.S. PATENT DOCUMENTS

| 4,619,894 A | * | 10/1986 | Bozler et al. | 430/270.1 |
| 6,555,183 B2 | * | 4/2003 | Wang et al. | 427/535 |
| 2008/0166861 A1 | * | 7/2008 | Mizuno et al. | 438/513 |

* cited by examiner

*Primary Examiner* — Mohammad Choudhry
(74) *Attorney, Agent, or Firm* — Kilpatrick Townsend & Stockton LLP

(57) ABSTRACT

A method of selectively dry etching silicon from patterned heterogeneous structures is described. The method optionally includes a plasma process prior to a remote plasma etch. The plasma process may use a biased plasma to treat some crystalline silicon (e.g. polysilicon or single crystal silicon) to form amorphous silicon. Subsequently, a remote plasma is formed using a hydrogen-containing precursor to form plasma effluents. The plasma effluents are passed into the substrate processing region to etch the amorphous silicon from the patterned substrate. By implementing biased plasma processes, the normally isotropic etch may be transformed into a directional (anisotropic) etch despite the remote nature of the plasma excitation during the etch process.

15 Claims, 6 Drawing Sheets

HALOGEN-FREE GAS-PHASE SILICON ETCH

FIELD

The present invention relates to methods of etching silicon.

BACKGROUND

Integrated circuits are made possible by processes which produce intricately patterned material layers on substrate surfaces. Producing patterned material on a substrate is enabled by controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material relative to the second material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma generation of nitrogen trifluoride in combination with ion suppression techniques enables silicon to be selectively removed from a patterned substrate when the plasma effluents are flowed into the substrate processing region. However, the silicon selectivity occasionally needs to be even higher for various applications. Additional process flexibility is also desirable.

Methods are needed to increase process flexibility for silicon selective dry etch processes.

BRIEF SUMMARY

A method of selectively dry etching silicon from patterned heterogeneous structures is described. The method optionally includes a plasma process prior to a remote plasma etch. The plasma process may use a biased plasma to amorphize some crystalline silicon (e.g. polysilicon or single crystal silicon) to form amorphous silicon. Subsequently, a remote plasma is formed using a hydrogen-containing precursor to form plasma effluents. The plasma effluents are passed into the substrate processing region to etch the amorphous silicon from the patterned substrate. By implementing biased plasma processes, the normally isotropic etch may be transformed into a directional (anisotropic) etch despite the remote nature of the plasma excitation during the etch process.

Embodiments of the invention include methods of etching a patterned substrate. The methods include treating the patterned substrate with a local plasma formed from an inert gas. Treating the patterned substrate includes transitioning a crystalline silicon portion of the patterned substrate into an amorphous silicon portion of the patterned substrate ("amorphizing" the crystalline silicon portion). The local plasma is formed by applying a local plasma power to excite the local plasma. The methods further include etching the amorphous silicon portion of the patterned substrate. Etching the amorphous silicon portion of the patterned substrate includes flowing plasma effluents into a substrate processing region housing the patterned substrate after treating the patterned substrate. The plasma effluents are formed by flowing a hydrogen-containing precursor into a remote plasma region fluidly coupled to the substrate processing region while forming a remote plasma in the remote plasma region to produce the plasma effluents. Forming the remote plasma in the remote plasma region to produce the plasma effluents includes applying a remote RF plasma having a remote RF plasma power to the remote plasma region.

Embodiments of the invention include methods of etching a patterned substrate. The methods include transferring the patterned substrate into a substrate processing region separated from a remote plasma region by a showerhead. The patterned substrate includes an amorphous silicon portion overlying a crystalline silicon portion. The methods further include flowing a hydrogen-containing precursor into the remote plasma region while forming a remote plasma in the remote plasma region to produce plasma effluents. Forming the remote plasma in the remote plasma region to produce the plasma effluents includes applying an RF plasma having an RF plasma power to the remote plasma region. The methods further include transferring the plasma effluents through the showerhead and then into the substrate processing region. The methods further include etching the amorphous silicon portion.

Embodiments of the invention include methods of etching a substrate. The methods include treating the substrate with a local plasma formed from helium. Treating the patterned substrate includes transitioning a crystalline silicon portion of the substrate into an amorphous silicon portion of the substrate. The local plasma is formed by applying a local RF plasma power to excite the helium. The methods further include flowing molecular hydrogen into a remote plasma region while forming a remote plasma in the remote plasma region to produce plasma effluents. Forming the remote plasma in the remote plasma region to produce the plasma effluents includes applying an RF plasma having an RF plasma power to the remote plasma region. The methods further include passing the plasma effluents through a showerhead and into the substrate processing region. The methods further include etching the amorphous silicon portion of the substrate with the plasma effluents.

Additional embodiments and features are set forth in part in the description that follows, and in part will become apparent to those skilled in the art upon examination of the specification or may be learned by the practice of the embodiments. The features and advantages of the embodiments may be realized and attained by means of the instrumentalities, combinations, and methods described in the specification.

BRIEF DESCRIPTION OF THE DRAWINGS

A further understanding of the nature and advantages of the embodiments may be realized by reference to the remaining portions of the specification and the drawings.

Figure 1:
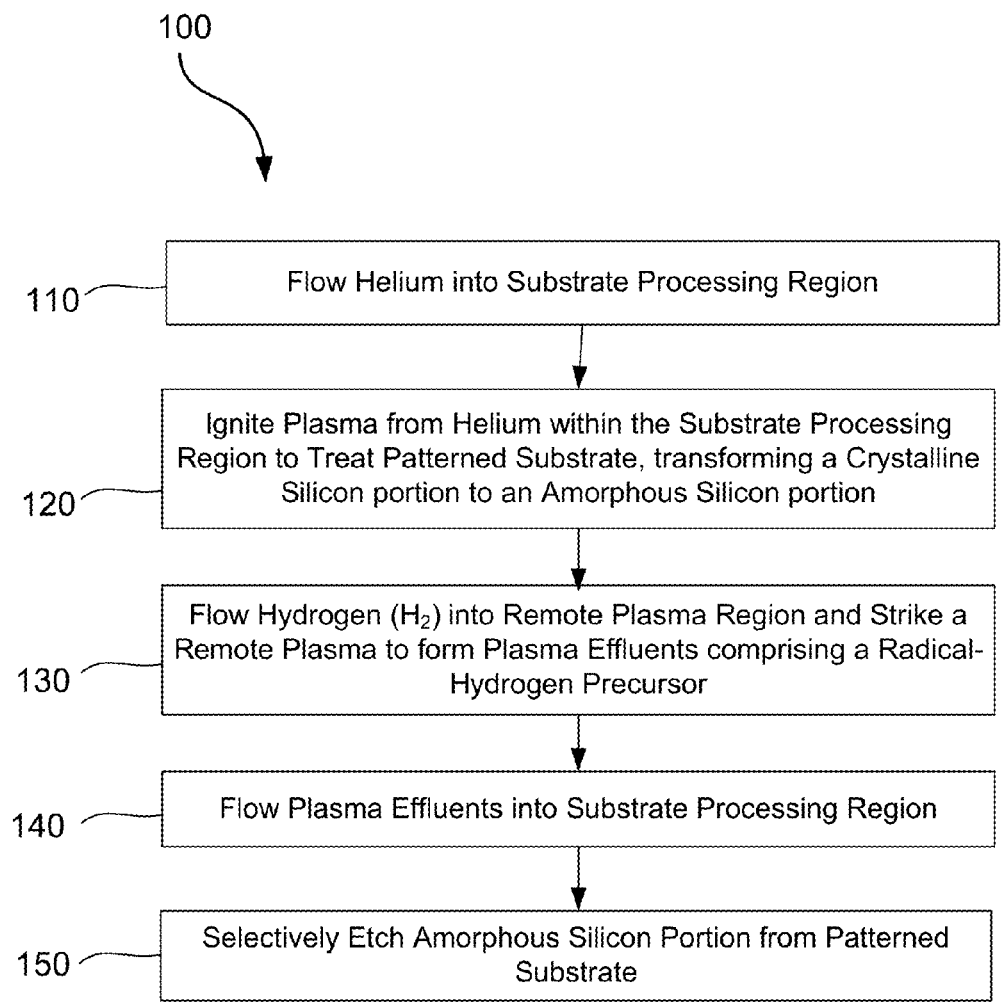
FIG. 1 is a flow chart of a silicon etch process according to embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A method of selectively dry etching silicon from patterned heterogeneous structures is described. The method optionally includes a plasma process prior to a remote plasma etch. The plasma process may use a biased plasma to treat some crystalline silicon (e.g. polysilicon or single crystal silicon) to form amorphous silicon from the crystalline silicon. Subsequently, a remote plasma is formed using a hydrogen-containing precursor to form plasma effluents. The plasma effluents are passed into the substrate processing region to etch the amorphous silicon from the patterned substrate. By implementing biased plasma processes, the normally isotropic etch may be transformed into a directional (anisotropic) etch despite the remote nature of the plasma excitation during the etch process.

Embodiments of the present invention pertain to selective removal of material from a substrate. The substrate may be crystalline silicon, e.g. polysilicon or single crystalline silicon. In embodiments, a substrate with exposed crystalline silicon is subjected to a local plasma treatment to change/transition a crystalline silicon portion into an amorphous silicon portion substrate ("amorphizing" the crystalline silicon portion). Before the local plasma treatment, the crystalline silicon portion may also be referred to herein as an untreated silicon region. After local plasma treatment, the portion of exposed silicon will be referred to as treated silicon or amorphous silicon to indicate a lack of crystalline order. The amorphous silicon is much more rapidly etched during the ensuing etching portion of the process. In some cases, an amorphous layer (or features) may already be present so the treatment step is optional.

During the etching operation, plasma effluents are generated using remote excitation of a hydrogen-containing precursor. The plasma effluents include a radical-hydrogen precursor. The plasma effluents are transferred into a substrate processing region housing the substrate. The plasma effluents are nearly completely or completely neutralized prior to entering the substrate processing region to increase the selectivity of the etching processes presented herein. The ionic content of the plasma effluents may be said to be essentially zero and more quantitative embodiments will be given shortly. The plasma effluents react with the amorphous silicon portion and preferentially remove the amorphous silicon from the patterned substrate. High selectivity of amorphous silicon compared to crystalline silicon has been observed, which desirably lessens the dependence on accurately selecting or controlling the duration of the etching process. The removal rate of the amorphous silicon is greater than the removal rate of crystalline silicon by a multiplicative factor of greater than two hundred, greater than three hundred, greater than four hundred or greater than six hundred according to embodiments. In practice, the etch rate of crystalline silicon regions was too small to measure, so the selectivities may well be much higher than these lower limits. The removal rate of amorphous silicon may be, similarly, much larger than an etch rate of silicon oxide, silicon nitride, high-k gate material and other non-silicon materials. In addition to the increase in removal rate, implementing a local plasma treatment makes the remote plasma etch process directional/anisotropic. The shape of removed silicon may be engineered to suit a variety of device performance goals.

An ion suppression element may be included in the remote etch processes described herein. The ion suppression element functions to reduce or eliminate ionic/charged species traveling from the plasma generation region to the substrate. Uncharged neutral and radical species may pass through the openings in the ion suppressor to react at the substrate. The ion suppressor helps control the concentration of ionic species in the reaction region at a level that increases selectivity.

In accordance with some embodiments of the invention, an ion suppressor as described in the exemplary equipment section may be used to provide radical and/or neutral species for selectively etching substrates. In one embodiment, for example, an ion suppressor is used to provide hydrogen-containing plasma effluents to selectively etch amorphous silicon. The ion suppressor may be used to provide a reactive gas having a higher concentration of radicals than ions. Because most (or essentially all in embodiments) of the charged particles of a plasma are filtered or removed by the ion suppressor, the substrate is not necessarily biased during the etch process. Such a process using radicals and other neutral species can reduce plasma damage compared to conventional plasma etch processes that include sputtering and bombardment. By filtering ions from the plasma effluents before they reach the substrate processing region, a high etch rate selectivity of amorphous silicon relative to crystalline silicon, silicon oxide, silicon nitride and many alternative materials may be achieved. Embodiments of the present invention are also advantageous over conventional wet etch processes where surface tension of liquids can cause bending and peeling of small features.

The ion suppressor may be used to provide plasma effluents having a much higher concentration of radicals than ions. The ion suppressor functions to dramatically reduce or substantially eliminate ionically charged species traveling from the plasma generation region to the substrate. The electron temperature may be measured using a Langmuir probe in the substrate processing region during excitation of a plasma in the remote plasma region on the other side of the ion suppressor. In embodiments, the electron temperature may be less than 0.5 eV, less than 0.45 eV, less than 0.4 eV, or less than 0.35 eV. These extremely low values for the electron temperature are enabled by the presence of the showerhead and/or the ion suppressor positioned between the substrate processing region and the remote plasma region. Uncharged neutral and radical species may pass through the openings in the ion suppressor to react at the substrate. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features.

The techniques presented herein enable a halogen-free process to selectively and/or anisotropically remove silicon (either amorphous or crystalline) from a substrate. Under certain circumstances, halogens have been found to gradually increase etch rate from one wafer to the next. The gradual increase presumably arises from a build-up of halopolymers (e.g. fluoropolymers or chloropolymers) or other halogen-containing residue on the interior walls of the remote plasma region and/or the substrate processing region. The halogen-free etch processes disclosed herein contain no halogens in the substrate processing region or the remote plasma region during the etching portion of the methods. For example, the substrate processing region may be fluorine-free, chlorine-free or halogen-free, in embodiments, during the etching portion of the methods presented herein. Similarly, the remote plasma region may be fluorine-free, chlorine-free or halogen-free, in embodiments, during the etching portion of the methods presented herein. The optional treatment operation, when included, also may occur in the substrate processing region or the treatment operation may occur in a separate substrate processing region. In either substrate processing region, the substrate processing region may be halogen-free during the treatment operation as well. For example, the substrate processing region may be fluorine-free, chlorine-free or halogen-free, in embodiments, during the treatment operation. The substrate processing region(s) and the remote plasma region may be oxygen-free during both the treatment operation and the etching operation according to embodiments.

Figures 2A, 2B:
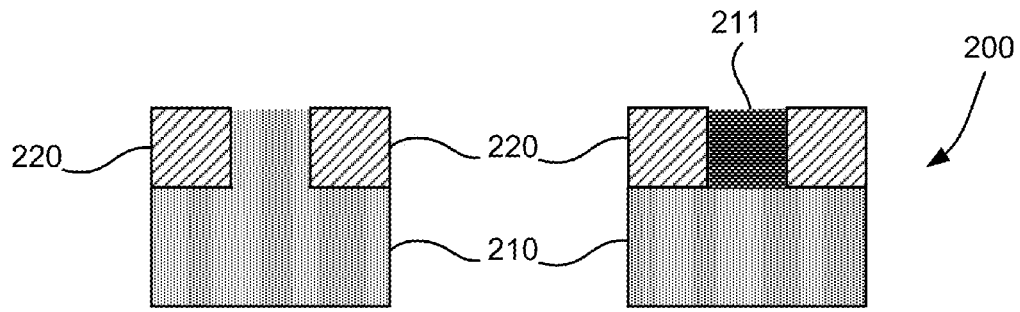
FIG. 2A-2D show cross-sectional views of a device at various stages during a silicon etch process according to embodiments.
Figures 2C, 2D:
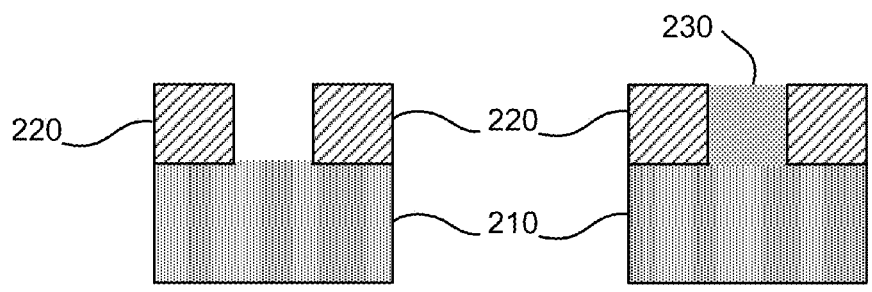

In order to better understand and appreciate embodiments of the invention, reference is now made to FIG. 1 which is a flow chart of an exemplary silicon etch process 100 according to embodiments. Cross-sectional views of a device at stages throughout the process may also be useful. Therefore, reference will concurrently be made to FIGS. 2A-2D which show cross-sectional views of an exemplary device during silicon etch processes (e.g. 100). In one example, a device 200 comprises a patterned substrate including crystalline silicon 210 and silicon oxide 220. A wide variety of other device configurations will also benefit from the silicon etch processes described herein. In one embodiment, the top portion of the substrate is silicon (untreated at the start of etch process 100) and may be single crystalline or polycrystalline (in which case it is usually referred to as polysilicon). Single crystal silicon is shown in the example depicted. Prior to a first operation, a structure is formed in the patterned substrate. The structure possesses separate exposed portions of the substrate, including crystalline silicon 210 and silicon oxide 220. In one embodiment, the etch process described below makes way for a "replacement" gate deposition which possesses desirably altered properties relative to the initial portion of crystalline silicon 210 which extends between silicon oxide 220. The replacement gate may be referred to herein as a replacement crystalline silicon portion. Crystalline silicon 210 is single crystal silicon in the example of FIGS. 1-2 but may be polysilicon according to embodiments.

The patterned substrate is then delivered into a substrate processing region. Helium is then flowed into the substrate processing region housing the patterned substrate (operation 110). The helium is excited in a local capacitively-coupled plasma within the substrate processing region in operation 120 and the patterned substrate is bombarded with helium ions. A DC voltage may be applied to further assist in the acceleration of helium ions toward the patterned substrate and to treat a portion of crystalline silicon 210 to form a treated substrate portion, also referred to herein as amorphous silicon portion 211. The substrate processing region may include other elements or the substrate processing region may consist only of helium in embodiments. The substrate processing region may be devoid of reactive species, such as $N_2$, $O_2$ and $H_2$, to avoid undesirable influences other than amorphization. A deposition component of the process may be considered undesirable and no deposition occurs during silicon etch process 100 in embodiments. The exemplary helium treatment (operation 110 of etch process 100) renders the initially crystalline material amorphous in a near-surface portion of the exposed substrate, transforming the untreated silicon portion into amorphous silicon portion 211. Amorphous silicon portion 211 may be subsequently etched more easily (at a greater etch rate). The material may be transitioning from polycrystalline or single-crystalline silicon to amorphous silicon during operation 120.

A flow of hydrogen is then introduced into a remote plasma region (operation 130 of etch process 100) where the hydrogen is excited in a remote plasma struck within the separate plasma region. The separate plasma region may be referred to as a remote plasma region herein and may be within a distinct module from the processing chamber or a compartment within the processing chamber separated from the substrate processing region by a permeable barrier. The permeable barrier is permeable to a flow of gases or precursors and may be referred to as a showerhead. In general, a hydrogen-containing precursor may be flowed into the remote plasma region and the hydrogen-containing precursor comprises at least one precursor selected from the group consisting of atomic hydrogen, diatomic hydrogen (a.k.a. molecular hydrogen or $H_2$), a halogen-free oxygen-free hydrocarbon, a fluorine-free oxygen-free hydrocarbon, a chlorine-free oxygen-free hydrocarbon, a hydrocarbon, a halogen-free oxygen-free nitrogen-and-hydrogen-containing precursor, a fluorine-free oxygen-free nitrogen-and-hydrogen-containing precursor, a chlorine-free oxygen-free nitrogen-and-hydrogen-containing precursor, a nitrogen-and-hydrogen-containing precursor, hydrazine, or ammonia in embodiments. The remote plasma region and/or the substrate processing region may be devoid of fluorine (or halogens in general) during operations 120-150 or each of operations 110-150 of etch process 100.

Continuing with embodiments of etch process 100, the plasma effluents formed in the remote plasma region are then flowed into the substrate processing region (operation 140) and the amorphous silicon portion 211 is selectively etched (operation 150). The plasma effluents may enter the substrate processing region through through-holes in a showerhead which separates the remote plasma region from the substrate processing region. Amorphous silicon portion 211 is removed at a higher rate than untreated silicon would etch in operation 150. An untreated silicon region (crystalline silicon) may be uncovered after removing the amorphous silicon portion. The reactive chemical species are removed from the substrate processing region and then the substrate is removed from the processing region.

Generally speaking, the helium used in the exemplary process of FIG. 1 may be any inert gas, where an inert gas contains only atoms (and ions, of course) which do not form covalent bonds in the treated film (the amorphous silicon). The inert gas may include one or more of helium, neon, or argon. The local plasma may consist of inert gases. In embodiments, the inert gas consists of helium, consists of argon, consists of neon or consists of neon. The inert gas consists of helium, argon, and/or neon in embodiments. The local plasma may consist essentially of inert gases. In some embodiments, the inert gas consists essentially of helium, consists essentially of neon or consists essentially of argon. The inert gas consists essentially of argon, neon and/or helium in embodiments. The term "essentially" is added to allow for a minority concentration of other elements which may be present in the substrate processing region, but do not react with exposed substrate portions to a degree which affects the selectivity and/or anisotropy of etch process 100.

The etch process 100 includes applying energy to the inert gas (e.g. helium) while in the substrate processing region to generate the ions used to treat the substrate (operation 120). The plasma may be generated using known techniques (e.g., radio frequency excitations, capacitively-coupled power, inductively coupled power). In an embodiment, the energy is applied using a capacitively-coupled plasma unit. The local plasma power may be between about 10 watts and about 500 watts, between about 20 watts and about 400 watts, between about 30 watts and about 300 watts, or between about 50 watts and about 200 watts in embodiments of the invention. Higher powers have been found to treat more deeply into crystalline silicon thereby increasing the vertical height (or "thickness") of amorphous silicon formed during the treatment operation 120. During operation 120, the pressure in the substrate processing region may be between about 0.5 mTorr and about 50 mTorr, between about 2 mTorr and about 200 mTorr or between about 5 mTorr and about 100 mTorr in embodiments. Also during operation 120, the temperature of the substrate may be between about −20° C. and about 400° C.

The etch process 100 also includes applying energy to the hydrogen-containing precursor while in the remote plasma region to generate the plasma effluents (operation 130). As would be appreciated by one of ordinary skill in the art, the plasma may include a number of charged and neutral species including radicals and ions. The plasma may be generated using known techniques (e.g., radio frequency excitations, capacitively-coupled power, inductively coupled power). In an embodiment, the energy is applied using a capacitively-coupled plasma unit. The remote plasma source power may be between about 100 watts and about 2000 watts, between about 200 watts and about 1500 watts, between about 250 watts and about 1200 watts, or between about 300 watts and about 1000 watts in embodiments of the invention. As with all complementary ranges provided herein, upper limits may be combined with any suitable lower limits to obtain additional embodiments. The pressure in the remote plasma region may be such that the pressure in the substrate processing region ends up between about 0.01 Torr and about 50 Torr, between about 0.1 Torr and about 15 Torr, or between about 0.5 Torr and about 5 Torr in embodiments. The capacitively-coupled plasma unit may be disposed remote from a gas reaction region of the processing chamber. For example, the capacitively-coupled plasma unit and the plasma generation region may be separated from the gas reaction region by a showerhead. Also during operations 120-140, the temperature of the substrate may be between about 100° C. and about 400° C.

During the etching operation 140, or each of operations 120-140, the term "plasma-free" may be used to describe the substrate processing region. The substrate processing region is where the plasma effluents react to etch portions of the patterned substrate. The plasma effluents may also be accompanied by inert gases. The substrate processing region may be described herein as "plasma-free" during etching of the substrate. "Plasma-free" does not necessarily mean the region is devoid of plasma. A relatively low concentration of ionized species and free electrons created within the remote plasma region do travel through pores (apertures) in the partition (showerhead/ion suppressor) due to the shapes and sizes of through-holes in the partition. In some embodiments, there is essentially no concentration of ionized species and free electrons within the substrate processing region. Embodiments for the electron temperature were provided earlier. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

The RF frequency applied for either the local or remote plasmas described herein may be low RF frequencies less than about 200 kHz, high RF frequencies between about 10 MHz and about 15 MHz, or microwave frequencies greater than or about 1 GHz in embodiments. The treated silicon portion may be referred to as an amorphous silicon portion or an amorphous silicon layer characterized by a vertical thickness as measured perpendicularly to the major plane of the substrate. Decreasing frequency has been found to increase the depth of the treatment operation such that the thickness of the amorphous silicon layer can be increased. The thickness of the amorphous silicon layer may be greater than 1 nm, greater than 2 nm or greater than 4 nm according to embodiments. The thickness of the amorphous silicon layer may be less than 20 nm, less than or about 15 nm, less than or about 12 nm in embodiments. Upper limits on thickness may be combined with lower limits of thickness to form additional embodiments. In a preferred embodiment, the thickness of the amorphous silicon layer may be between about 7 nm and about 10 nm.

The process 100 depicted in FIG. 1 may be succinctly described as treat-etch sequences. More generally, treat-etch-treat-etch sequences and treat-etch-treat-etch-treat-etch sequences are also possible. Breaking up the etch process into multiple treat-etch cycles the etch process to remove greater thicknesses of crystalline silicon 210. In other words, the process of operations 110-120 enables treatment of a certain depth of crystalline silicon 210. Etching in operation 150 beyond the treated silicon portion will lower the effective etch rate of the combined process. Multiple cycles may be desirable to allow each cycle to avoid attempting to etch beyond the amorphized silicon portion and wasting time, precursors and/or energy. Each cycle may have the thicknesses described for the amorphous silicon layer earlier. In this way, the depth may be increased without increasing the plasma power or reducing the plasma frequency during the treatment operation.

A native oxide may be present on exposed portions of silicon which have been exposed to oxygen or the atmosphere. The native oxide can be removed by local plasma processes, remote plasma processes which form sublimatable salts or chemical treatments carried out at atmospheric pressures. Regardless of the method used, the native oxide (if present) may or may not be removed before the operation of treating and etching the exposed silicon. The plasma treatment has been found, in embodiments, to remove (or enable the subsequent removal of) the thin native oxide in addition to treating the exposed silicon portion. Finally, the terms "exposed silicon portion" and "exposed silicon" will be used herein regardless of whether a thin native oxide is present.

Etch process 100 may exhibit a pronounced anisotropy in etch rate, in other words, the compound etch may remove material more rapidly vertically down into the substrate than laterally. Embodiments of the present invention enable the production of smaller devices by restricting the lateral incursion. In many applications, the trench width of various examples including that of FIG. 2 may be less than or about 30 nm, less than or about 25 nm, less than or about 20 nm or less than or about 15 nm in embodiments of the invention. These trench widths apply to a variety of applications and go beyond the single example discussed herein. The etch processes described herein may remove material vertically faster than laterally by a multiplicative factor greater than or about two, greater than or about three or greater than or about four in embodiments.

Figure 3:
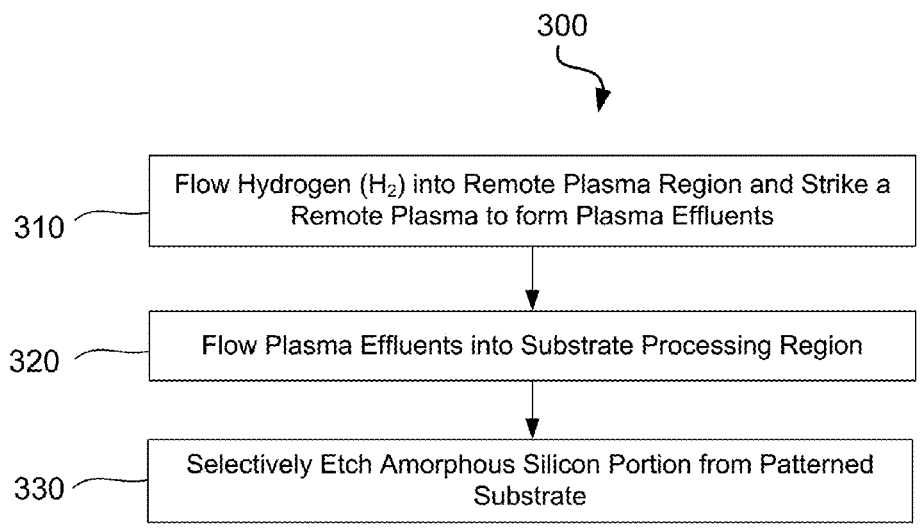
FIG. 3 is a flow chart of a silicon etch process according to embodiments.

FIG. 3 shows another flow chart of a silicon etch process according to embodiments. In some cases, an amorphous layer (or features) may already be present so the treatment step is optional. In such a case, a patterned substrate with preexisting exposed amorphous silicon regions is transferred into a substrate processing region. A flow of hydrogen is introduced into a remote plasma region (operation 310 of etch process 300) where the hydrogen is excited in a remote plasma struck within the remote plasma region. A showerhead or permeable barrier is present between the remote plasma region and the substrate processing region as before. A hydrogen-containing precursor may generally be used in place of or to augment the hydrogen ($H_2$) and exemplary precursors were presented previously. The remote plasma region and/or the substrate processing region may be devoid of halogen during operations 310-330 of etch process 300.

Continuing with embodiments of etch process 300, the plasma effluents formed in the remote plasma region are then flowed into the substrate processing region (operation 320) and the preexisting amorphous silicon portion is selectively etched (operation 330). The plasma effluents may enter the substrate processing region through through-holes in a showerhead which separates the remote plasma region from the substrate processing region. The amorphous silicon portion is removed at a higher rate than crystalline silicon would etch in operation 330. As before, crystalline silicon may be uncovered after removing the amorphous silicon portion. The reactive chemical species are removed from the substrate processing region and then the substrate is removed from the processing region.

The flow of the hydrogen-containing precursor may further include one or more relatively inert gases such as He, $N_2$, Ar. The inert gas can be used to improve plasma stability and process uniformity as well as to make it easier to strike or maintain a plasma. Argon is helpful, as an additive, to promote the formation of a stable plasma, however, inclusion of argon may sputter other features besides the crystalline silicon so inert gases of low mass (<25 amu or <10 amu in embodiments) may be selected. Process uniformity is generally increased when helium is included and helium is a preferred choice of treatment gas in embodiments. Flow rates and ratios of the different gases may be used to control etch rates and etch selectivity.

During the etching portion of the process, the hydrogen-containing gas (e.g. $H_2$) is supplied at a flow rate of between about 50 sccm (standard cubic centimeters per minute) and 1,000 sccm. Optionally, an inert gas such as He or Ar maybe combined with the hydrogen-containing gas or directly flowed into the substrate processing region, e.g., at a flow rate of between about 0 slm (standard liters per minute) and 3 slm. During the treatment portion of the process, the inert gas or unreactive gas may be flowed into the substrate processing region with a flow rate between 0.5 slm and about 3 slm in embodiments of the invention. One of ordinary skill in the art would recognize that other gases and/or flows may be used depending on a number of factors including processing chamber configuration, substrate size, geometry and layout of features being etched.

Figure 4A:
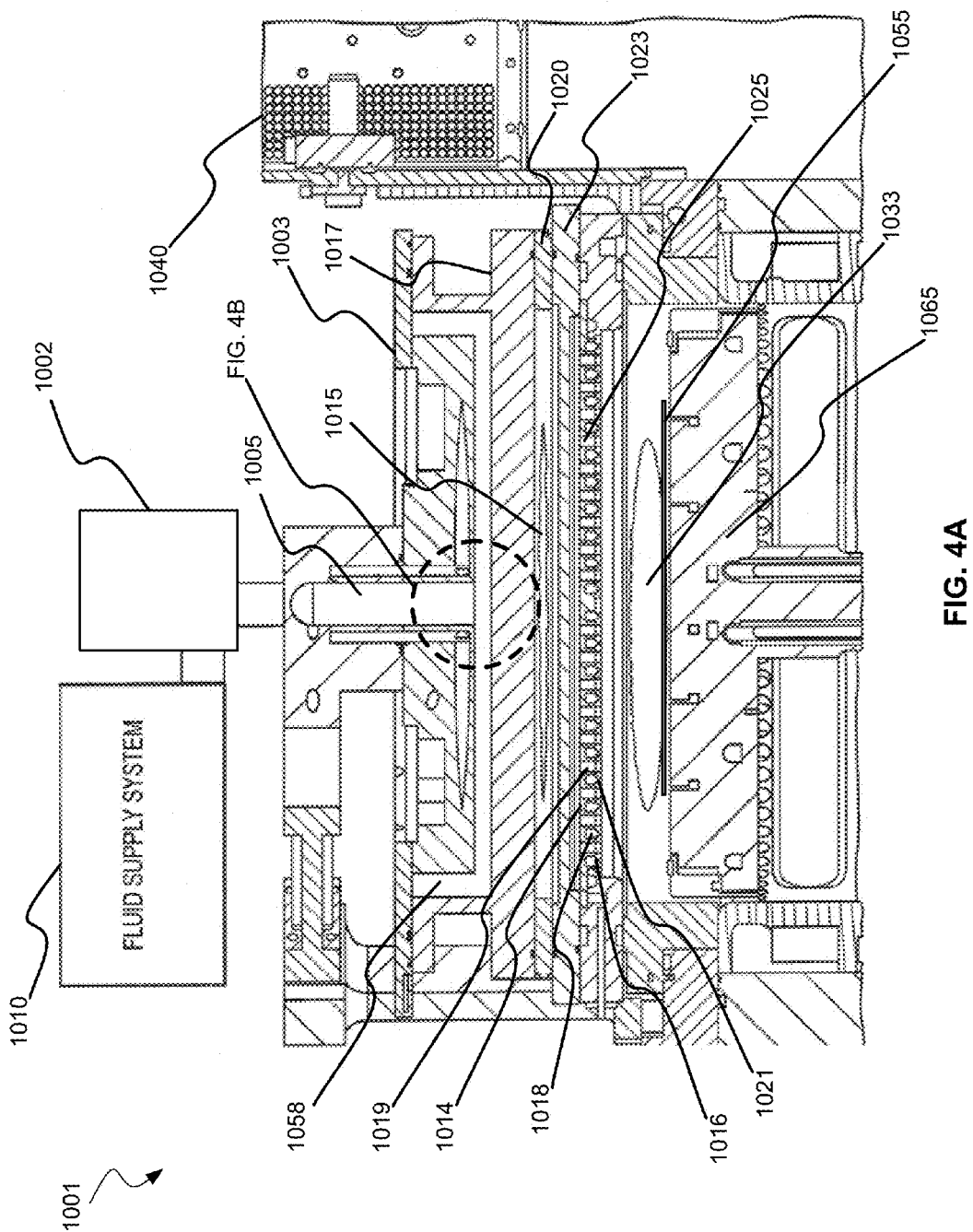
FIG. 4A shows a schematic cross-sectional view of a substrate processing chamber according to embodiments.

Additional process parameters are disclosed in the course of describing an exemplary processing chamber and system.
Exemplary Processing System FIG. 4A shows a cross-sectional view of an exemplary substrate processing chamber 1001 with partitioned plasma generation regions within the processing chamber. During film etching, a process gas may be flowed into chamber plasma region 1015 through a gas inlet assembly 1005. A remote plasma system (RPS) 1002 may optionally be included in the system, and may process a first gas which then travels through gas inlet assembly 1005. The inlet assembly 1005 may include two or more distinct gas supply channels where the second channel (not shown) may bypass the RPS 1002, if included. Accordingly, in embodiments the precursor gases may be delivered to the processing chamber in an unexcited state. In another example, the first channel provided through the RPS may be used for the process gas and the second channel may be used for a precursor which bypasses the RPS. The process gas may be excited within the RPS 1002 prior to entering the chamber plasma region 1015. Accordingly, the hydrogen-containing precursor as discussed above, for example, may pass through RPS 1002 or bypass the RPS unit in embodiments. Various other examples encompassed by this arrangement will be similarly understood.

A cooling plate 1003, faceplate 1017, ion suppressor 1023, showerhead 1025, and a substrate support 1065 (also known as a pedestal), having a substrate 1055 disposed thereon, are shown and may each be included according to embodiments. The pedestal 1065 may have a heat exchange channel through which a heat exchange fluid flows to control the temperature of the substrate. This configuration may allow the substrate 1055 temperature to be cooled or heated to maintain relatively low temperatures, such as between about −20° C. to about 200° C., or there between. The heat exchange fluid may comprise ethylene glycol and/or water. The wafer support platter of the pedestal 1065, which may comprise aluminum, ceramic, or a combination thereof, may also be resistively heated to relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 1065, which may be further configured to rotate.

The faceplate 1017 may be pyramidal, conical, or of another similar structure with a narrow top portion expanding to a wide bottom portion. The faceplate 1017 may additionally be flat as shown and include a plurality of through-channels used to distribute process gases. Plasma generating gases and/or plasma excited species, depending on use of the RPS 1002, may pass through a plurality of holes, shown in FIG. 4B, in faceplate 1017 for a more uniform delivery into the chamber plasma region 1015.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region. A baffle (not shown) may additionally be located in the chamber plasma region 1015, or otherwise coupled with gas inlet assembly 1005, to affect the flow of fluid into the region through gas inlet assembly 1005.

The ion suppressor 1023 may comprise a plate or other geometry that defines a plurality of apertures throughout the structure that are configured to suppress the migration of ionically-charged species out of chamber plasma region 1015 while allowing uncharged neutral or radical species to pass through the ion suppressor 1023 into an activated gas delivery region between the suppressor and the showerhead. In embodiments, the ion suppressor 1023 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 1023 may provide increased control over the gas mixture brought into contact with the underlying wafer substrate, which in turn may increase control of the deposition and/or etch characteristics of the gas mixture. For example, adjustments in the ion concentration of the gas mixture may alter etch selectivity.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor.

The ion suppression element 1023 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate is not always the goal. In many instances, the etch rate of the remote plasma etch process increases when ionic species are able to reach the substrate. In these instances, the ion suppressor may help to control the concentration of ionic species in the reaction region at a level that assists the process.

Showerhead 1025 in combination with ion suppressor 1023 may allow a plasma present in chamber plasma region 1015 to avoid directly exciting gases in substrate processing region 1033, while still allowing excited species to travel from chamber plasma region 1015 into substrate processing region 1033. In this way, the chamber may be configured to prevent the plasma from contacting a substrate 1055 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which silicon oxide or silicon nitride etch may increase.

The processing system may further include a power supply 1040 electrically coupled with the processing chamber to provide electric power to the faceplate 1017, ion suppressor 1023, showerhead 1025, and/or pedestal 1065 to generate a plasma in the chamber plasma region 1015 or processing region 1033. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to chamber plasma region 1015. This in turn may allow development of particular plasma characteristics such that precursors may be dissociated in specific ways to enhance the etching profiles produced by these precursors.

A plasma may be ignited either in chamber plasma region 1015 above showerhead 1025 or substrate processing region 1033 below showerhead 1025. A plasma may be present in chamber plasma region 1015 to produce the radical-hydrogen precursors from an inflow of the hydrogen-containing precursor. An AC voltage typically in the radio frequency (RF) range may be applied between the conductive top portion of the processing chamber, such as faceplate 1017, and showerhead 1025 and/or ion suppressor 1023 to ignite a plasma in chamber plasma region 1015 during deposition. An RF power supply may generate a high RF frequency of 13.56 MHz but may also generate other frequencies alone or in combination with the 13.56 MHz frequency.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF power may be between about 10 watts and about 5000 watts, between about 100 watts and about 2000 watts, between about 200 watts and about 1500 watts, or between about 200 watts and about 1000 watts in embodiments. The RF frequency applied in the exemplary processing system may be low RF frequencies less than about 200 kHz, high RF frequencies between about 10 MHz and about 15 MHz, or microwave frequencies greater than or about 1 GHz in embodiments. The plasma power may be capacitively-coupled (CCP) or inductively-coupled (ICP) into the remote plasma region.

Chamber plasma region 1015 (top plasma in figure) may be left at low or no power when a bottom plasma in the substrate processing region 1033 is turned on to, for example, cure a film or clean the interior surfaces bordering substrate processing region 1033. A plasma in substrate processing region 1033 may be ignited by applying an AC voltage between showerhead 1025 and the pedestal 1065 or bottom of the chamber. A treatment gas (such as helium) may be introduced into substrate processing region 1033 while the plasma is present to facilitate treatment of the patterned substrate. The showerhead 1025 may also be biased at a positive DC voltage relative to the pedestal 1065 or bottom of the chamber to accelerate positively charged ions toward patterned substrate 1055. In embodiments, the local plasma in substrate processing region 1033 may be struck by applying AC power via an inductively-coupled source while applying DC power by capacitively coupled means. As indicated previously, the local plasma power may be between about 10 watts and about 500 watts, between about 20 watts and about 400 watts, between about 30 watts and about 300 watts, or between about 50 watts and about 200 watts in embodiments of the invention.

A fluid, such as a precursor, for example a hydrogen-containing precursor, may be flowed into the processing region 1033 by embodiments of the showerhead described herein. Excited species derived from the process gas in chamber plasma region 1015 may travel through apertures in the ion suppressor 1023, and/or showerhead 1025 and react with an additional precursor flowing into the processing region 1033 from a separate portion of the showerhead. Alternatively, if all precursor species are being excited in chamber plasma region 1015, no additional precursors may be flowed through the separate portion of the showerhead. Little or no plasma may be present in the processing region 1033 during the remote plasma etch process. Excited derivatives of the precursors may combine in the region above the substrate and/or on the substrate to etch structures or remove species from the substrate.

Exciting the fluids in the chamber plasma region 1015 directly, or exciting the fluids in the RPS units 1002, may provide several benefits. The concentration of the excited species derived from the fluids may be increased within the processing region 1033 due to the plasma in the chamber plasma region 1015. This increase may result from the location of the plasma in the chamber plasma region 1015. The processing region 1033 may be located closer to the chamber plasma region 1015 than the remote plasma system (RPS) 1002, leaving less time for the excited species to leave excited states through collisions with other gas molecules, walls of the chamber, and surfaces of the showerhead.

The uniformity of the concentration of the excited species derived from the process gas may also be increased within the processing region 1033. This may result from the shape of the chamber plasma region 1015, which may be more similar to the shape of the processing region 1033. Excited species created in the RPS 1002 may travel greater distances to pass through apertures near the edges of the showerhead 1025 relative to species that pass through apertures near the center of the showerhead 1025. The greater distance may result in a reduced excitation of the excited species and, for example, may result in a slower growth rate near the edge of a substrate. Exciting the fluids in the chamber plasma region 1015 may mitigate this variation for the fluid flowed through RPS 1002, or alternatively bypassed around the RPS unit.

The processing gases may be excited in chamber plasma region 1015 and may be passed through the showerhead 1025 to the processing region 1033 in the excited state. While a plasma may be generated in the processing region 1033, a plasma may alternatively not be generated in the processing region. In one example, the only excitation of the processing gas or precursors may be from exciting the processing gases in chamber plasma region 1015 to react with one another in the processing region 1033. As previously discussed, this may be to protect the structures patterned on the substrate 1055.

In addition to the fluid precursors, there may be other gases introduced at varied times for varied purposes, including carrier gases to aid delivery. A processing gas may be introduced to remove unwanted species from the chamber walls, the substrate, the deposited film and/or the film during deposition. A processing gas may be excited in a plasma and then used to reduce or remove residual content inside the chamber.

In some embodiments the processing gas may be used without a plasma. The processing gas may be introduced to the processing region 1033, either through the RPS unit or bypassing the RPS unit, and may further be excited in the first plasma region.

Figure 4B:
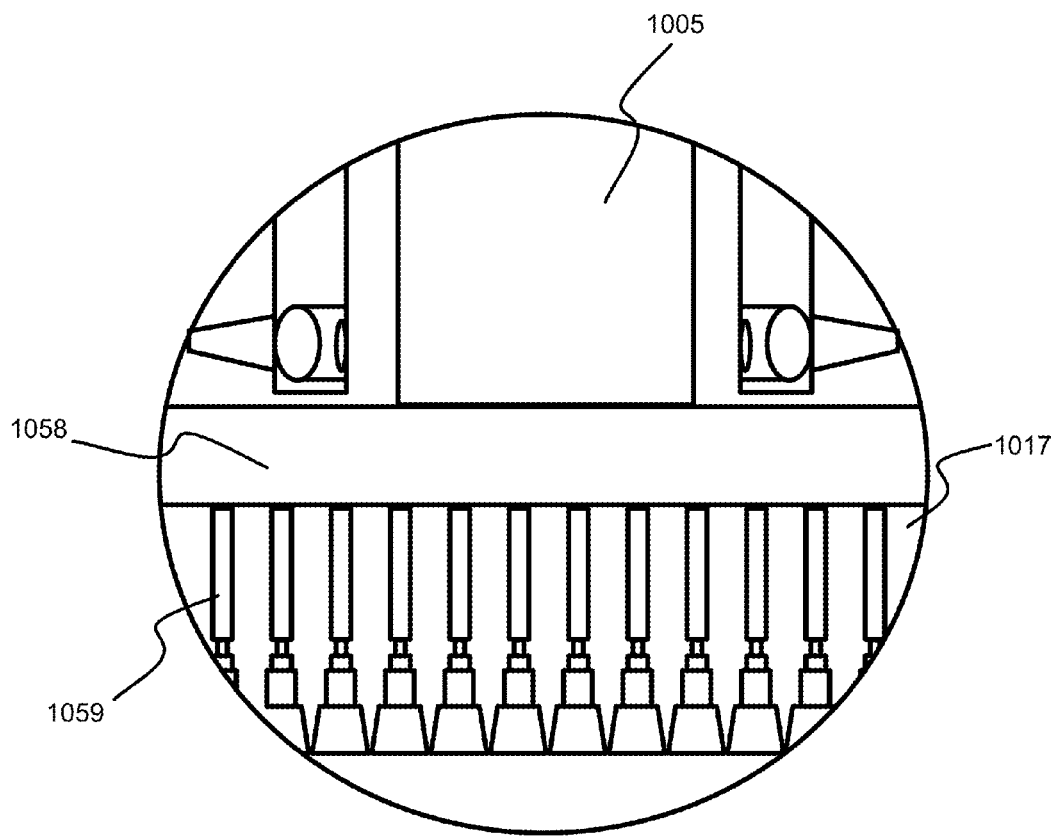
FIG. 4B shows a schematic cross-sectional view of a portion of a substrate processing chamber according to embodiments.

FIG. 4B shows a detailed view of the features affecting the processing gas distribution through faceplate 1017. As shown in FIG. 4A and FIG. 4B, faceplate 1017, cooling plate 1003, and gas inlet assembly 1005 intersect to define a gas supply region 1058 into which process gases may be delivered from gas inlet 1005. The gases may fill the gas supply region 1058 and flow to chamber plasma region 1015 through apertures 1059 in faceplate 1017. The apertures 1059 may be configured to direct flow in a substantially unidirectional manner such that process gases may flow into processing region 1033, but may be partially or fully prevented from backflow into the gas supply region 1058 after traversing the faceplate 1017.

Figure 4C:
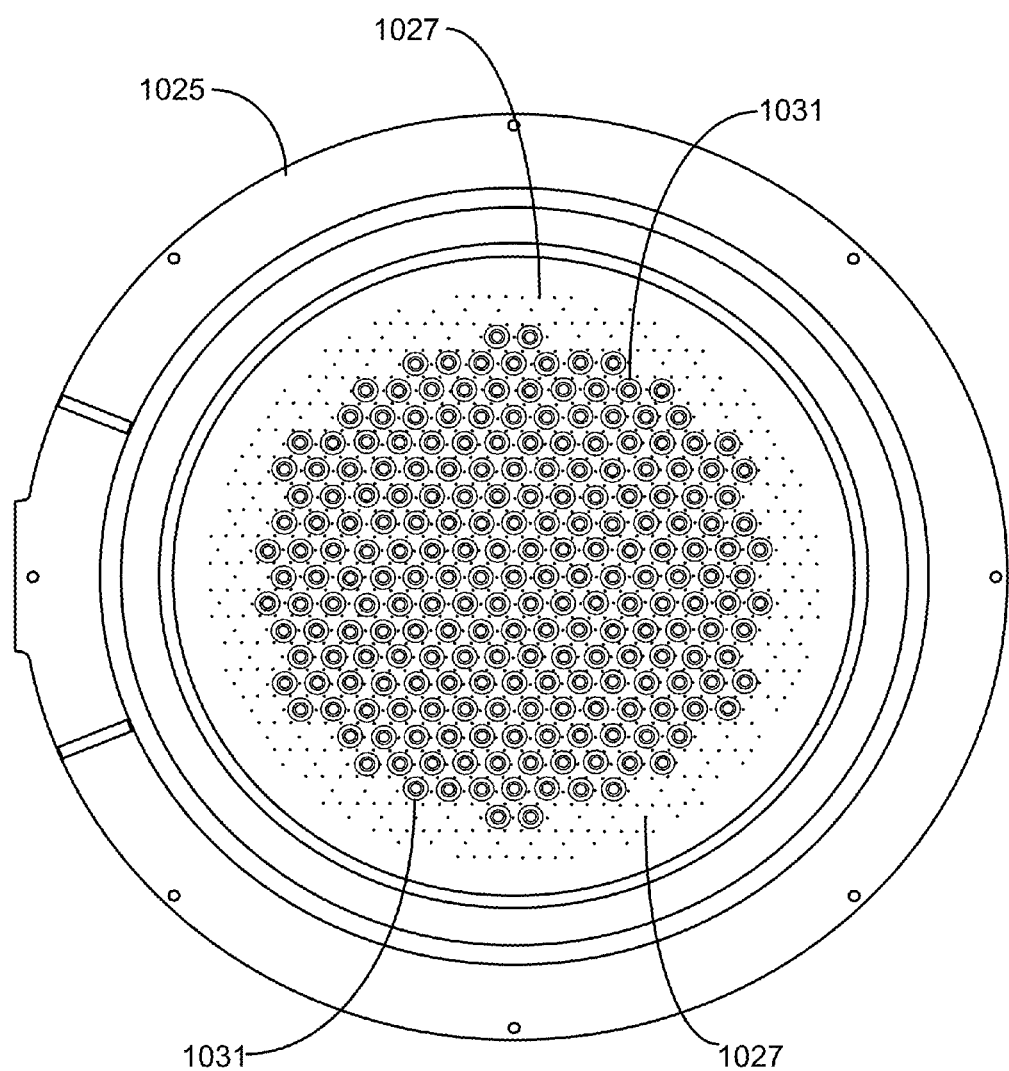
FIG. 4C shows a bottom plan view of a showerhead according to embodiments.

The gas distribution assemblies such as showerhead 1025 for use in the processing chamber section 1001 may be referred to as dual channel showerheads (DCSH) and are additionally detailed in the embodiments described in FIG. 4A as well as FIG. 4C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 4A-4C includes a dual-channel showerhead, it is understood that alternative distribution assemblies may be utilized that maintain first and second precursors fluidly isolated prior to the processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 process gases which contain plasma effluents upon excitation by a plasma in chamber plasma region 1015. In embodiments, the process gas introduced into the RPS 1002 and/or chamber plasma region 1015 may contain hydrogen. The process gas may also include a carrier gas such as helium, argon, nitrogen ($N_2$), etc. Plasma effluents may include ionized or neutral derivatives of the process gas and may also be referred to herein as a radical-hydrogen precursor referring to the atomic constituent of the process gas introduced.

FIG. 4C is a bottom view of a showerhead 1025 for use with a processing chamber in embodiments. Showerhead 1025 corresponds with the showerhead shown in FIG. 4A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

The chamber plasma region 1015 or a region in an RPS may be referred to as a remote plasma region. In embodiments, the radical precursor, e.g., a radical-hydrogen precursor, is created in the remote plasma region and travels into the substrate processing region where it may or may not combine with additional precursors. In embodiments, the additional precursors are excited only by the radical-hydrogen precursor. Plasma power may essentially be applied only to the remote plasma region in embodiments to ensure that the radical-hydrogen precursor provides the dominant excitation. Hydrogen ($H_2$) or another hydrogen-containing precursor may be flowed into chamber plasma region 1015 at rates between about 5 sccm and about 1,000 sccm, between about 50 sccm and about 750 sccm, or between about 125 sccm and about 550 sccm in embodiments.

Combined flow rates of precursors into the chamber may account for 0.05% to about 20% by volume of the overall gas mixture; the remainder being carrier gases. The hydrogen-containing precursor may be flowed into the remote plasma region, but the plasma effluents may have the same volumetric flow ratio in embodiments. In the case of the hydrogen-containing precursor, a purge or carrier gas may be first initiated into the remote plasma region before the hydrogen-containing gas to stabilize the pressure within the remote plasma region. Substrate processing region 1033 can be maintained at a variety of pressures during the flow of precursors, any carrier gases, and plasma effluents into substrate processing region 1033. The pressure may be maintained between about 0.01 Torr and about 50 Torr, between about 0.1 Torr and about 20 Torr or between about 0.2 Torr and about 10 Torr in embodiments.

Figure 5:
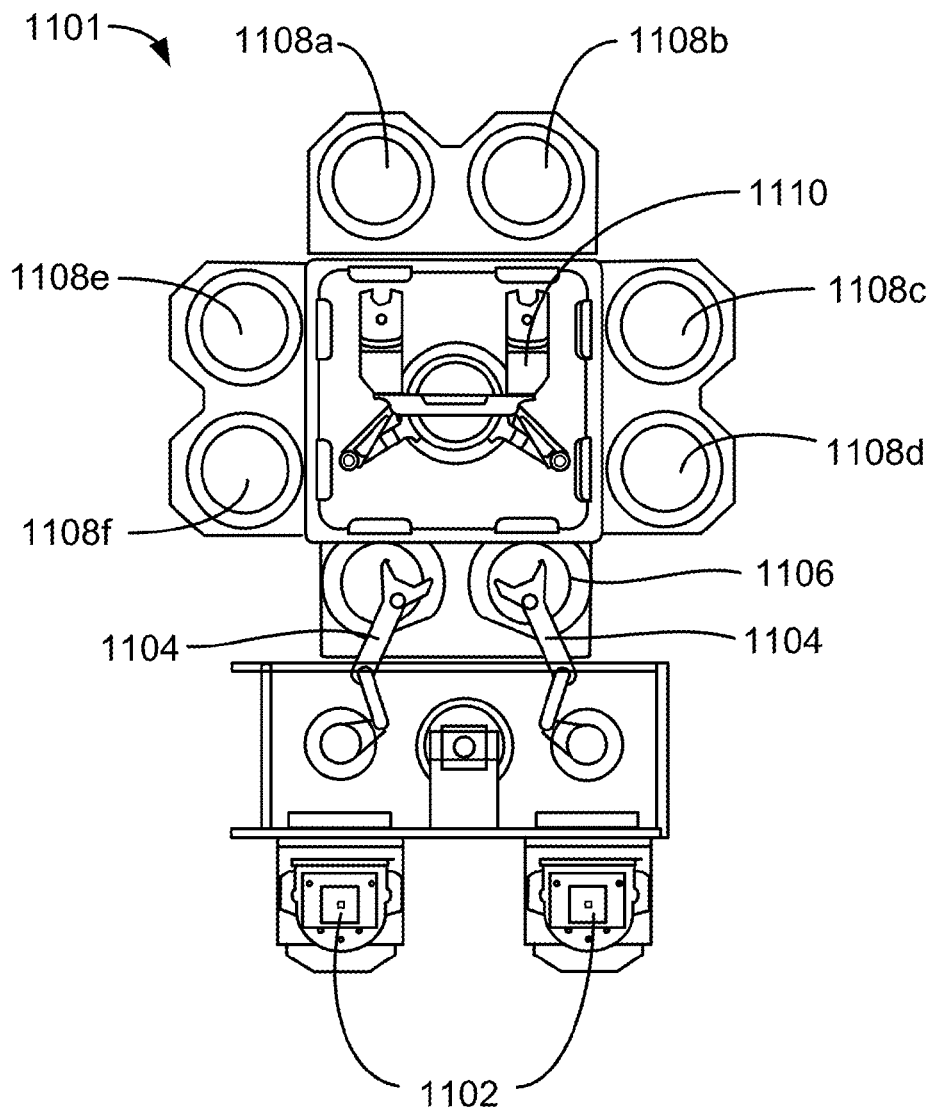
FIG. 5 shows a top plan view of an exemplary substrate processing system according to embodiments.

Embodiments of the deposition systems may be incorporated into larger fabrication systems for producing integrated circuit chips. FIG. 5 shows one such processing system 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, preclean, degas, orientation, and other substrate processes.

The substrate processing chambers 1108a-f may include one or more system components for depositing, annealing, curing and/or etching a dielectric film on the substrate wafer. In one configuration, two pairs of the processing chamber, e.g., 1108c-d and 1108e-f, may be used to deposit dielectric material on the substrate, and the third pair of processing chambers, e.g., 1108a-b, may be used to etch the deposited dielectric. In another configuration, all three pairs of chambers, e.g., 1108a-f, may be configured to etch a dielectric film on the substrate. Any one or more of the processes described may be carried out in chamber(s) separated from the fabrication system shown in embodiments.

In the preceding description, for the purposes of explanation, numerous details have been set forth to provide an understanding of various embodiments of the present invention. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly Si but may include minority concentrations of other elemental constituents such as nitrogen, oxygen, hydrogen or carbon. Exposed "silicon" may consist of or consist essentially of silicon. Exposed "silicon nitride" of the patterned substrate is predominantly $Si_3N_4$ but may include minority concentrations of other elemental constituents such as oxygen, hydrogen or carbon. "Exposed silicon nitride" may consist essentially of or consist of silicon and nitrogen. Exposed "silicon oxide" of the patterned substrate is predominantly $SiO_2$ but may include minority concentrations of other elemental constituents such as nitrogen, hydrogen or carbon. In embodiments, silicon oxide films etched using the methods taught herein consist essentially of or consist of silicon and oxygen.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-hydrogen" are radical precursors which contain hydrogen but may contain other elemental constituents. The words "inert" and "unreactive" as applied to gases and chemical species refer to the lack of formation of chemical bonds between the atoms of the gases/chemical species and atoms of the substrate during and after processing a film. Exemplary unreactive chemical species/inert gases include noble gases but may include other gases so long as no chemical bonds are formed when (typically) trace amounts are trapped in a film. Along the same lines, "reactive species" do form chemical bonds during etching and deposition.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a substrate, the method comprising:
   treating the substrate with a local plasma formed from an inert gas, wherein treating the substrate comprises transitioning a crystalline silicon portion of the substrate into an amorphous silicon portion of the substrate and wherein the local plasma is formed by applying a local plasma power to excite the local plasma; and
   etching the amorphous silicon portion of the substrate, wherein etching the amorphous silicon portion of the substrate comprises flowing plasma effluents into a substrate processing region housing the substrate after treating the substrate, wherein the plasma effluents are formed by flowing a hydrogen-containing precursor into a remote plasma region fluidly coupled to the substrate processing region while forming a remote plasma in the remote plasma region to produce the plasma effluents, wherein forming the remote plasma in the remote plasma region to produce the plasma effluents comprises applying a remote RF plasma having a remote RF plasma power to the remote plasma region.

2. The method of claim 1 wherein the inert gas comprises one or more of helium, neon or argon.

3. The method of claim 1 wherein the local plasma is devoid of reactive species during treating the substrate.

4. The method of claim 1 wherein the crystalline silicon portion of the substrate comprises one of single crystal silicon or polysilicon.

5. The method of claim 1 wherein the amorphous silicon portion created during treating the substrate is completely removed during etching the amorphous silicon portion of the substrate.

6. The method of claim 1 wherein an etch rate of the amorphous silicon portion is over two hundred times an etch rate of the crystalline silicon portion during etching the amorphous silicon portion of the substrate.

7. The method of claim 1 wherein the hydrogen-containing precursor comprises molecular hydrogen.

8. The method of claim 1 wherein etching the amorphous silicon portion of the substrate comprises anisotropically etching the amorphous silicon portion.

9. The method of claim 1 further comprising growing a replacement crystalline silicon portion where the crystalline silicon portion had been.

10. A method of etching a patterned substrate, the method comprising:
    transferring the patterned substrate into a substrate processing region separated from a remote plasma region by a showerhead, wherein the patterned substrate comprises an amorphous silicon portion overlying a crystalline silicon portion;
    flowing a hydrogen-containing precursor into the remote plasma region while forming a remote plasma in the remote plasma region to produce plasma effluents, wherein forming the remote plasma in the remote plasma region to produce the plasma effluents comprises applying a remote RF plasma having a remote RF plasma power to the remote plasma region;
    transferring the plasma effluents through the showerhead and then into the substrate processing region; and
    etching the amorphous silicon portion.

11. The method of claim 10 wherein the remote plasma region is devoid of fluorine during the flowing of the hydrogen-containing precursor into the remote plasma region.

12. The method of claim 10 wherein the crystalline silicon portion abuts the amorphous silicon portion at an interface and etching the amorphous silicon portion comprises terminating the method at the interface.

13. The method of claim 10 wherein the hydrogen-containing precursor comprises at least one of a hydrocarbon, a nitrogen-and-hydrogen-containing precursor or hydrogen.

14. The method of claim 10 wherein the remote plasma region and the substrate processing region consist only of hydrogen and inert gases during the operation of etching the amorphous silicon portion.

15. A method of etching a substrate, the method comprising:
    treating the substrate with a local plasma formed from helium, wherein treating the substrate comprises transitioning a crystalline silicon portion of the substrate into an amorphous silicon portion of the substrate and wherein the local plasma is formed by applying a local plasma power to excite the helium; and
    flowing molecular hydrogen into a remote plasma region while forming a remote plasma in the remote plasma region to produce plasma effluents, wherein forming the remote plasma in the remote plasma region to produce the plasma effluents comprises applying an RF plasma having an RF plasma power to the remote plasma region;
    passing the plasma effluents through a showerhead and into the substrate processing region; and
    etching the amorphous silicon portion of the substrate with the plasma effluents.

* * * * *